(12) United States Patent
McCallister

(10) Patent No.: US 8,934,854 B2
(45) Date of Patent: Jan. 13, 2015

(54) TRANSMITTER WITH PEAK-TRACKING PAPR REDUCTION AND METHOD THEREFOR

(75) Inventor: Ronald Duane McCallister, Scottsdale, AZ (US)

(73) Assignee: CrestCom, Inc., Scottsdale, AZ (US)

(*) Notice: Subject to any disclaimer, the term of this patent is extended or adjusted under 35 U.S.C. 154(b) by 232 days.

(21) Appl. No.: 13/597,762

(22) Filed: Aug. 29, 2012

(65) Prior Publication Data

US 2014/0065986 A1    Mar. 6, 2014

(51) Int. Cl.
*H04B 1/04* (2006.01)
*H04B 17/00* (2006.01)

(52) U.S. Cl.
USPC ............ 455/114.3; 455/63.1; 455/67.13; 455/127.1; 375/297

(58) Field of Classification Search
CPC ....... H03G 3/20; H03F 1/0211; H03F 1/0216; H03F 1/0222; H03F 1/3247; H03F 2200/451; H03F 2201/3233; H03F 3/189; H04B 1/02; H04B 1/0475
USPC ............ 455/63.1, 67.11, 67.13, 114.2, 114.3, 455/115.1, 126, 127.1; 375/296, 297
See application file for complete search history.

(56) References Cited

U.S. PATENT DOCUMENTS

| | | | |
|---|---|---|---|
| 4,291,277 A | 9/1981 | Davis et al. | |
| 5,049,832 A | 9/1991 | Cavers | |
| 6,104,761 A | 8/2000 | McCallister et al. | |
| 6,366,619 B1 | 4/2002 | McCallister et al. | |
| 7,026,868 B2 | 4/2006 | Robinson et al. | |
| 7,295,816 B2 | 11/2007 | McCallister | |
| 7,482,869 B2 | 1/2009 | Wilson | |
| 7,570,931 B2 | 8/2009 | McCallister et al. | |
| 7,715,811 B2* | 5/2010 | Kenington | 455/127.1 |
| 7,747,224 B2 | 6/2010 | McCallister et al. | |
| 7,764,060 B2 | 7/2010 | Wilson | |
| 7,783,260 B2 | 8/2010 | McCallister et al. | |
| 7,792,505 B2* | 9/2010 | Mueller et al. | 455/126 |

(Continued)

FOREIGN PATENT DOCUMENTS

WO    WO2012061038 A1    5/2012

OTHER PUBLICATIONS

Sahu et al., "A High-Efficiency Linear RF Power Amplifier With a Power-Tracking Dynamically Adaptive Buck Boost Supply," IEEE Transactions on Microwave Theory and Techniques, Jan. 2004, pp. 112-120, vol. 52 No. 1, © 2004 IEEE, USA.

Wang et al., "Design of Wide-Bandwidth Envelope-Tracking Power Amplifiers for OFDM Applications," IEEE Transactions on Microwave Theory and Techniques, Apr. 2004, pp. 1244-1255, vol. 53 No. 4, © 2005 IEEE, USA.

International Search Report and the Written Opinion of PCT/US13/57088, ISA, Dec. 5, 2013.

*Primary Examiner* — Quochien B Vuong
(74) *Attorney, Agent, or Firm* — Schmeiser, Olsen & Watts LLP; Lowell W. Gresham

(57) ABSTRACT

A transmitter (20) includes a peak reduction section (30), a predistorter (98), and an amplifying section (102) biased by a variable bias signal generator (118). The peak reduction section (30) is controlled by a signal magnitude threshold (36) that defines maximum magnitudes for local peaks (32) of a reduced-peak communication signal (38). The bias signal generator (118) is controlled by a bias control signal (110). Both the signal magnitude threshold (36) and the bias control signal (110) are derived from a common reduced bandwidth (50) peak-tracking signal (42). The peak-tracking signal (42) is derived from an inflated-peak communication signal (26). The predistorter (98) applies distortion to the reduced-peak communication signal (38) that is configured, at least in part, by the bias control signal (110).

20 Claims, 10 Drawing Sheets

(56) References Cited

U.S. PATENT DOCUMENTS

| | | |
|---|---|---|
| 7,868,698 B2 | 1/2011 | Wilson |
| 8,093,945 B2 | 1/2012 | Wimpenny |
| 8,093,946 B2 | 1/2012 | Wimpenny et al. |
| 8,159,295 B2 * | 4/2012 | Asbeck et al. ............... 330/136 |
| 8,416,893 B2 * | 4/2013 | Gandhi et al. ............... 375/345 |
| 2009/0004981 A1 | 1/2009 | Eliezer et al. |
| 2009/0097590 A1 | 4/2009 | McCallister et al. |
| 2009/0227215 A1 | 9/2009 | McCallister |
| 2010/0015932 A1 | 1/2010 | Liang et al. |
| 2011/0092173 A1 | 4/2011 | McCallister et al. |
| 2012/0134399 A1 | 5/2012 | Gandhi et al. |

* cited by examiner

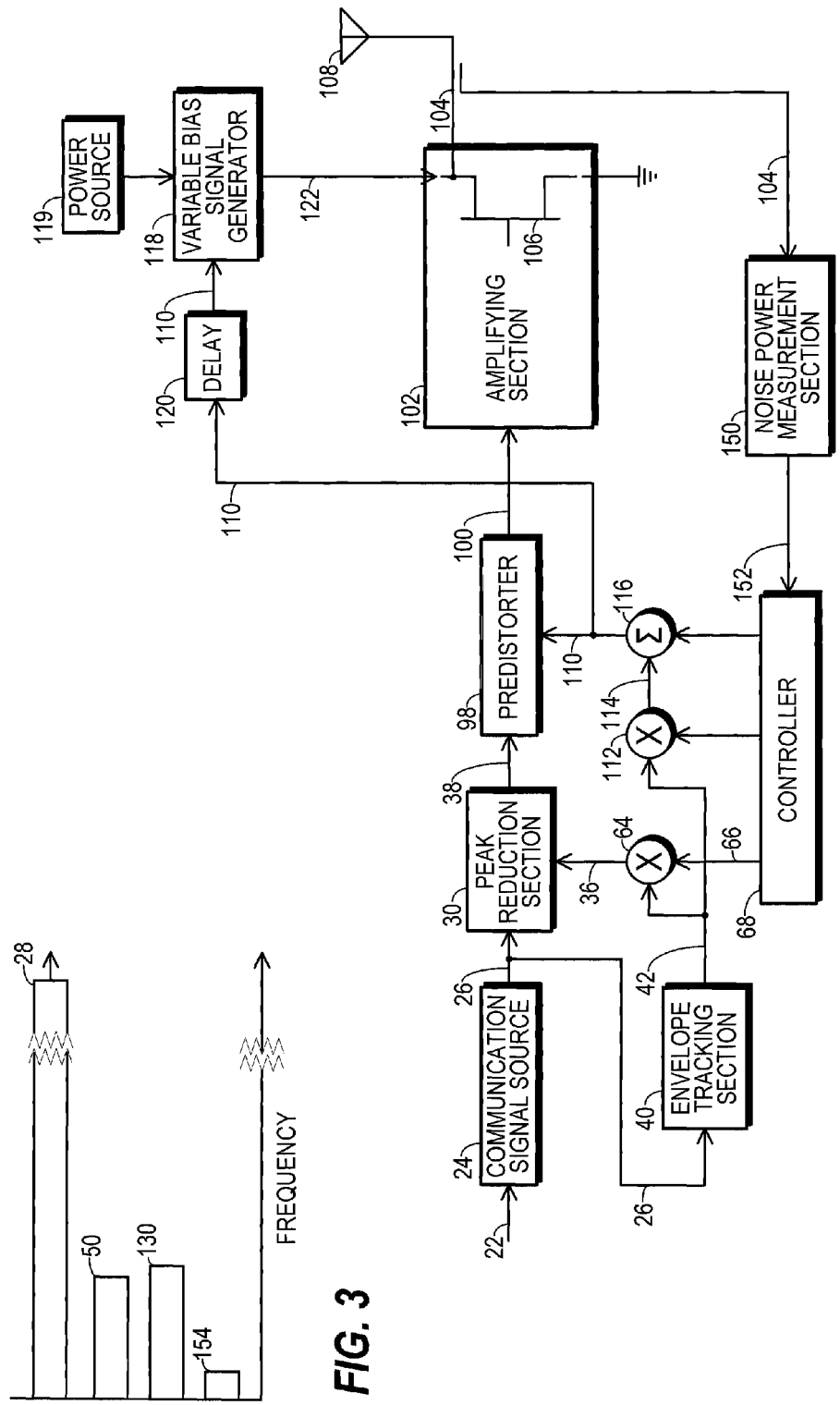

TRANSMITTER WITH PEAK-TRACKING PAPR REDUCTION AND METHOD THEREFOR

TECHNICAL FIELD OF THE INVENTION

The present invention relates generally to the field of radio-frequency (RF) communication systems. Specifically, the present invention relates to transmitters that include circuits and/or processes for the purpose of reducing peak-to-average power ratio (PAPR) in communication signals and that include circuits and/or processes to dynamically control RF amplifier bias signals.

BACKGROUND OF THE INVENTION

An RF power amplifier provides the final stage of amplification for a communication signal that has been modulated and converted into an RF signal. Often that RF signal exhibits frequencies in a predetermined frequency band that is licensed by a regulatory agency for a particular use. The RF power amplifier boosts the power of this RF communication signal to a level sufficient so that the signal, when it propagates to an antenna, will be broadcast in such a manner that it will meet the communication goals of the RF transmitter.

Many popular modern modulation techniques, such as CDMA, QAM, OFDM, and the like, require the RF power amplifier to perform a linear amplification operation. In other words, the RF communication signal conveys both amplitude and phase information, and the RF power amplifier should faithfully reproduce both the amplitude and phase content of the RF signal presented at its input. While perfect linearity is a goal for any linear RF power amplifier, all linear RF power amplifiers invariably fail to meet it. The degree to which the goal of perfect linearity is missed leads to unwanted intermodulation, nonlinearities, and spectral regrowth.

The regulatory agencies that license RF spectrum for use by RF transmitters define spectral masks with which transmitters should comply. The spectral masks set forth how much RF energy may be transmitted from the RF transmitters in specified frequency bands. As transmitter technology has advanced, and as increasing demands have been placed on the scarce resource of the RF spectrum by the public, the spectral masks have become increasingly strict. In other words, very little energy outside of an assigned frequency band is permitted to be transmitted from an RF transmitter. Accordingly, unless the spectral regrowth that results from any nonlinearity in the amplification process is held to a very low level, the RF transmitter will be in violation of its regulatory spectral mask.

In conventional RF transmitters, the amplifier linearity requirement is usually difficult to achieve at a reasonable cost. In general, more sophisticated and expensive amplifiers can be devised which exhibit better linearity. But always, cost is desirably minimized, and the minimization of cost is particularly important for mass market devices, such as cell phones, tablet devices, and other handheld devices, that include RF transmitters. In many applications, the poor linearity of a low cost amplifier may be made acceptable through the use of pre- or post-amplification distortion cancelation, compensation or linearizing techniques that lead to cost improvements when compared to the use of sophisticated and expensive amplifiers.

In conventional RF transmitters, the amplifier linearity and cost parameters are counterbalanced against power-added efficiency (PAE). Power-added efficiency is the ratio of the RF output power to the sum of the input RF power and the applied bias-current power. An amplifier that has low PAE wastes power, which is undesirable in any transmitter, but particularly undesirable in battery-powered transmitters because it necessitates the use of undesirably large batteries and/or undesirably frequent recharges. Conventionally, improvements in PAE have been achieved at the expense of linearity.

Another factor that affects costs, linearity, and PAE is an RF amplifier's dynamic range. A peak of a communication signal represents the greatest instantaneous amplitude, magnitude, or power level exhibited by a communication signal within some period of time. An amplifier that is required to have a large dynamic range and to faithfully reproduce a communication signal with occasional large peaks also tends to be more expensive and exhibit less PAE than amplifiers that are not required to have such a large dynamic range. And, if the amplifier simply does a poor job of reproducing the peaks, then linearity suffers. From another perspective, an RF amplifier with a smaller dynamic range may be a used if a communication signal is attenuated so that its occasional large peaks fit within the smaller dynamic range. But this causes the average power level to be reduced, thereby reducing link margins and reducing the amount of data that may be communicated over the link.

To address these competing RF amplifier design considerations, conventional transmitters have added various circuits to compensate for the shortcomings of a less expensive RF amplifier. One such circuit is dynamic amplifier bias control, which may improve PAE. While various forms of dynamic amplifier bias control are known, an envelope-tracking technique has particularly desirable attributes. Envelope tracking provides a bias control signal that roughly follows the envelope of the RF communication signal, but does not completely follow the envelope. The envelope tracking technique generates the amplifier bias control signal to exhibit a significantly lower bandwidth than the RF communication signal, but to nevertheless track the RF communication signal's magnitude peaks. One example of an envelope tracking form of dynamic amplifier bias control is described in U.S. Pat. No. 7,570,931, issued 4 Aug. 2009, and entitled "RE Transmitter With Variably Biased RF Power Amplifier And Method Therefor," which is incorporated by reference in its entirety herein.

The lowered bandwidth lowers the switching frequency requirements in the power supply that generates the bias voltage applied to the RF power amplifier's power input. In theory, accurately following the RF communication signal's envelope over a higher bandwidth would achieve greater PAE improvements, but in practice it would require the use of such an expensive power supply that any cost savings in the RF amplifier would be lost. Moreover, a large amount of power is likely to be consumed by such a higher bandwidth power supply, and additional unwanted RF noise is likely to be generated. The use of a lowered bandwidth amplifier bias control signal permits the use of a low power, low noise, low cost power supply that can nevertheless achieve significant PAE improvements.

Unfortunately, dynamic amplifier bias control does nothing to lessen dynamic range constraints for the RF amplifier. Thus, an alternate circuit that conventional transmitters have devised to address the competing RF amplifier design considerations and compensate for the shortcomings of a less expensive RF amplifier is a peak-to-average-power-ratio (PAPR) reduction circuit. An average of the communication signal represents the average amplitude, magnitude, or power level of the communication signal over a given period. The peak is greater than the average, and the ratio of the peak power to the average power (PAPR) is a parameter of interest to communication system designers.

One example of a PAPR reduction circuit is described in U.S. Pat. No. 7,747,224, issued 29 Jun. 2010, and entitled "Method and Apparatus For Adaptively Controlling Signals", which is incorporated by reference in its entirety herein. A PAPR reduction circuit like the one described in U.S. Pat. No. 7,747,224 and elsewhere, reduces the communication signal peaks prior to amplification, thereby reducing dynamic range constraints on the amplifier. And, by reducing the largest peaks of the communication signal, the biasing voltage for the RF amplifier may be reduced, thereby improving PAE at the same time. Most linear power amplifiers become more power efficient as the PAPR decreases. And, other benefits come from operating transmitters at a lower peak but greater average power, such as increasing link margins and permitting greater amounts of data to be transmitted in a given period of time.

The reduction of communication signal peaks in a PAPR reduction circuit, also referred to below as a peak reduction (PR) circuit, introduces noise into the communication signal, but the PR circuit is desirably configured so that this noise is primarily located in-band and so that no spectral mask violations occur. The transmitted in-band noise is often characterized using an error-vector magnitude (EVM) parameter. EVM specifications are based upon achieving a desired signal-to-noise ratio (SNR) at a receiver for a given modulation order and coding rate. EVM may be designated as the ratio of the total amount of noise power in a communication signal to the total signal power in that signal. It is usually specified as a percentage, equal to one-hundred divided by the square-root of the SNR.

In the version of a PR circuit described in U.S. Pat. No. 7,747,224, a signal magnitude threshold, which defines the level of the peaks in a reduced-peak version of the communication signal, may be controlled to maintain the EVM parameter precisely at a maximum amount allowed by the transmitter's specifications. In other words, if an EVM specification allows the transmitter to transmit more in-band noise, then the transmitter spends some of its available EVM budget in order to get improved PAE and link margins.

FIG. 1 shows a chart that graphically depicts the operation of this PR circuit with respect to a defined threshold. An inflated-peak communication signal 10 is presented to the peak reduction circuit (not shown), depicted as the magnitude of signal 10 in FIG. 1. Communication signal 10 includes a local peak 12 at the apex of an excursion portion 14 that extends above a signal magnitude threshold 16. The goal of the peak reduction circuit is to remove excursion portion 14, thereby reducing the magnitude of local peak 12 and causing the magnitude of a reduced-peak communication signal to follow the dotted line trajectory 18 in the vicinity of excursion portion 14 rather than to include excursion portion 14. Desirably, excursion portion 14 is removed in a manner that primarily introduces in-band distortion into the reduced-peak communication signal, when compared to the inflated-peak communication signal.

Signal magnitude threshold 16 defines the maximum peak values achieved in the resulting reduced-peak communication signal. By increasing signal magnitude threshold 16, less peak reduction results, less power-added efficiency (PAE) is achievable in a downstream RF power amplifier, and a lower average power output is available from the RF power amplifier. But, less noise is introduced into the communication signal. By decreasing signal magnitude threshold 16, a greater amount of peak reduction results, more power-added efficiency (PAE) is achievable in the RF power amplifier, and a higher average power output is available from the RF power amplifier. But, these beneficial power amplifier consequences come at the cost of introducing more noise into the communication signal.

This prior art peak reduction circuit contemplates the possible use of a variable signal magnitude threshold 16. In particular, an error-vector magnitude (EVM) indicator (not shown) or other control indicator may be used to adjust signal magnitude threshold 16 by increasing and decreasing so that noise power is held roughly constant, slightly below the maximum EVM permitted for the communication system of which the peak reduction circuit is a part.

But the EVM or other control indicators are deeply lagging and slowly varying indicators. As a deeply lagging indicator, the indicator is responsive to a portion of the communication signal that occurred over some past period in time compared to the current state of the communication signal. And that past period in time typically occurred far in the past, at a delay greater than the latency of all remaining circuits in the transmitter downstream of the peak reduction circuit. It is not a precise indicator of the current state of the communication signal being processed in the PR circuit. The EVM indicator, for example, is slowly varying because it is formed by accumulating instantaneous indications obtained by processing the amplifier's output signal over a considerable duration. As a consequence, the conventional lagging-indicator signal magnitude threshold signal 16 appears to be virtually invariant over the duration of excursion 14 and even over the entire time reflected in FIG. 1.

Unfortunately, conventional PR circuits with lagging-indicator signal magnitude threshold signals tend to reduce peaks in a way that is too imprecise and is largely incompatible with dynamic amplifier bias control. In other words, power savings and PAE improvements may be achieved through dynamic amplifier bias control, and similar improvements may be achieved by using a PR circuit, but using both conventional dynamic amplifier bias control and a conventional PR circuit tends to introduce no significant further improvements to those achievable using either one alone.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 2 shows a simplified block diagram of a transmitter configured in accordance with one embodiment of the present invention;

FIG. 3 shows a chart of relative bandwidths for various signals generated in the transmitter of FIG. 2;

DETAILED DESCRIPTION OF THE PREFERRED EMBODIMENTS

Figure 1:
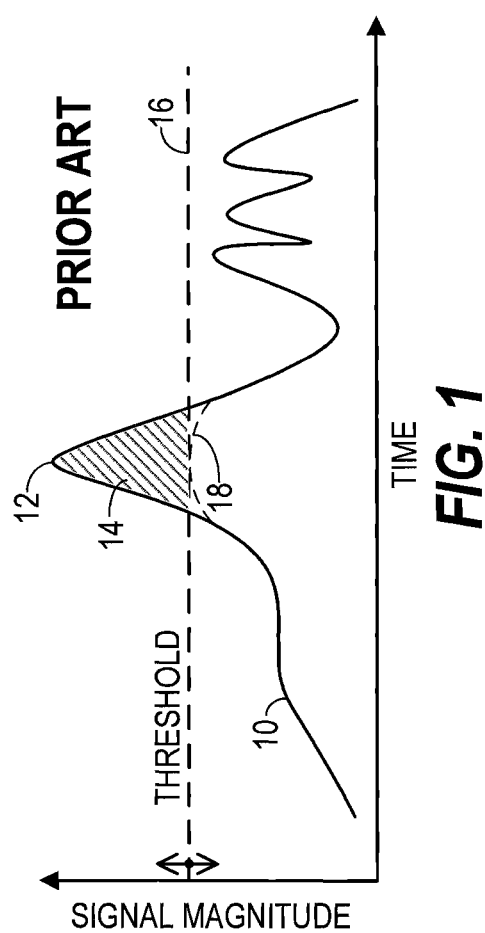
FIG. 1 shows a chart that graphically depicts the operation of a prior art peak reduction circuit with respect to a defined threshold.

FIG. 2 shows a simplified block diagram of a transmitter 20 configured in accordance with one embodiment of the present invention. In the embodiment explicitly depicted in the figures, transmitter 20 is configured to wirelessly transmit an RF communication signal. But those skilled in the art will appreciate that the present invention may also be used in other types of communication systems, including a communication system that transmits optical signals through an optical transmission medium, a system that transmits signals to a magnetic recording medium, and in other applications, such as audio amplification.

Transmitter 20 receives one or more raw data streams 22 at an input to a communication signal source 24. Communication signal source 24 provides a digitally modulated, complex, baseband version of an inflated-peak communication signal 26. A communication signal, such as inflated-peak communication signal 26 and others discussed below, is an electronic signal that may undergo a variety of different processing steps and be represented in a variety of different ways, including as one or more digital streams of data or as one or more analog signals. A communication signal has been modulated with information and/or data provided by raw data stream(s) 22. The transmission of this information and/or data is the primary purpose of transmitter 20, and a communication signal could be demodulated or otherwise processed to recover the information and/or data. While a communication signal may have received a wide variety of processing steps, such steps have not destroyed the information and/or data conveyed in amplitude and phase so that such information and/or data would be unrecoverable.

Communication signal source 24 may perform any number of activities well known to those skilled in the art of digital transmitters. For example, raw data stream 22 may be digitally modulated using a suitable form of digital modulation, such as QPSK, CDMA, OFDM, or the like. Multiple data streams 22 may have been digitally modulated and combined together for transmission, as is common in a cellular base station, or a single data stream 22 may have been digitally modulated for transmission, as is common in an end-user's wireless device, such as a cell phone, touchpad, laptop, netbook, electronic book, wireless network adapter, wireless router, and the like. The digitally modulated signal may have been pulse shaped to limit bandwidth while minimizing intersymbol interference (ISI). The processing performed by communication signal source 24 may inflate the peaks of the communication signal compared to what the peaks might have otherwise been. Any or all of these and other types of signal processing activities may be performed at communication signal source 24.

FIG. 3 shows a chart of relative bandwidths for various signals generated in transmitter 20. Referring to FIGS. 2-3, as a result of the processing performed at communication signal source 24, inflated-peak communication signal 26 is a baseband, digitally modulated, complex signal that exhibits a bandwidth 28 roughly equal to the bandwidth allocated to transmitter 20 for the transmission of RF energy. Bandwidth 28 is typically set by a governmental agency which controls licensing of spectrum and devices that use the spectrum. For inflated-peak communication signal 26, bandwidth 28 resides at baseband (i.e., near DC). Desirably, inflated-peak communication signal 26 is an analytic signal having a bandwidth centered at or near 0 Hz.

The inflated-peak communication signal 26 version of the communication signal may exhibit undesirably high peaks, causing a peak-to-average power ratio (PAPR) parameter to be undesirably high as well. Accordingly, an output of communication signal source 24 couples to an input of a peak reduction section 30. Peak reduction section 30 processes inflated-peak communication signal 26 to reduce its PAPR. Peak reduction section 30 is desirably implemented so that a reduced-peak communication signal 38 form of the communication signal generated by peak reduction section 30 remains compatible with spectral mask and other noise specifications (e.g., EVM specifications) imposed on transmitter 20. The terms "inflated-peak" and "reduced-peak" are used herein in a relative sense, where inflated-peak communication signal 26 generally exhibits higher peaks than reduced-peak communication signal 38, regardless of any particular processing steps that may or may not actually inflate or reduce peaks.

Figure 4:
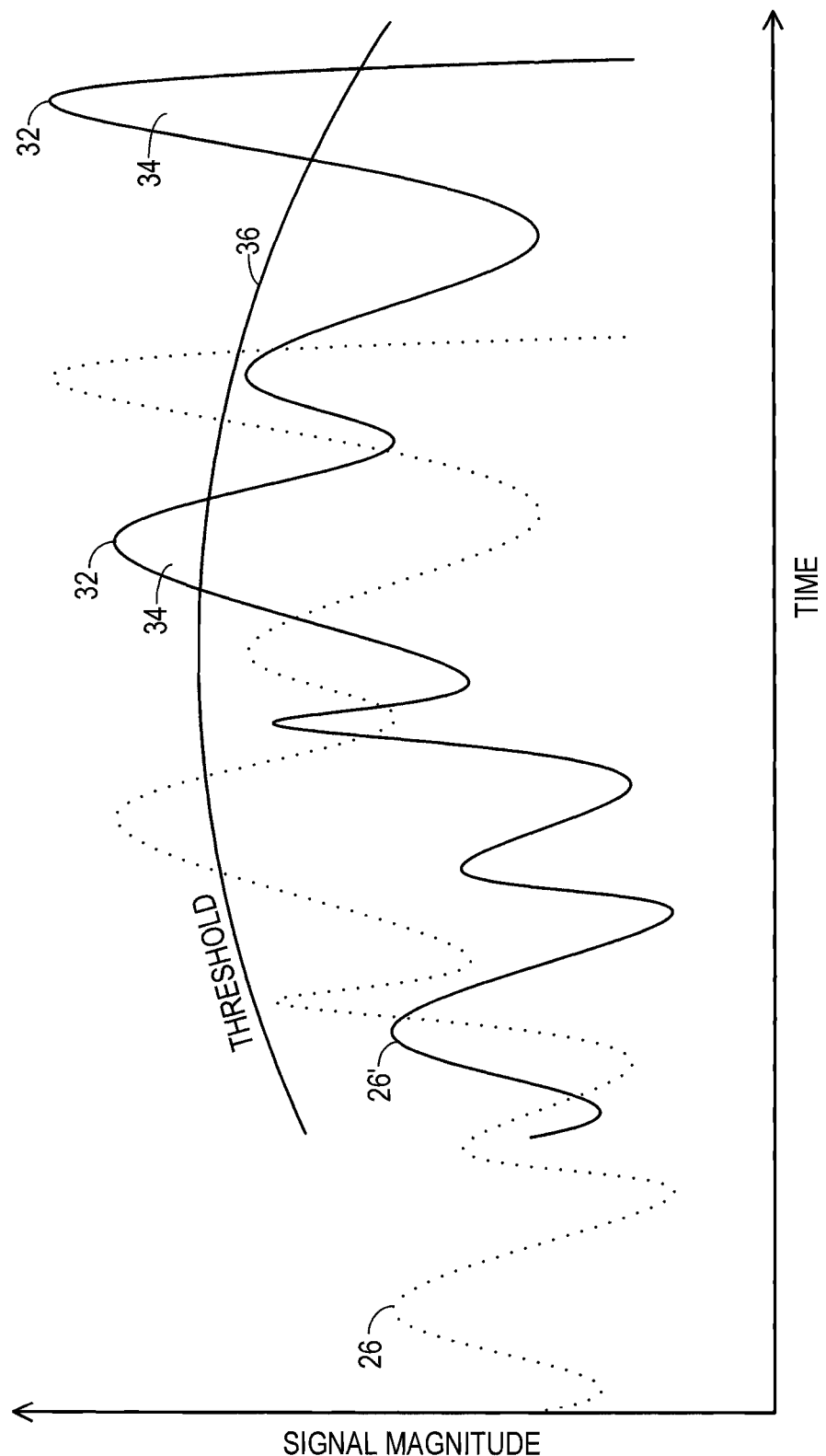
FIG. 4 shows a chart that graphically depicts the operation of a peak reduction section with respect to a defined threshold in the transmitter of FIG. 2.

FIG. 4 shows a chart that graphically depicts the operation of peak reduction section 30 with respect to a defined threshold. Referring to FIG. 1 for contrast and to FIGS. 2 and 4, inflated-peak communication signal 26 is presented to peak reduction section 30. FIG. 4 shows the magnitude of signal 26 as a dotted line. Within peak reduction section 30, signal 26 is delayed to produce a delayed inflated-peak communication signal 26', whose magnitude is depicted in FIG. 4 as a solid line. Signal 26' includes several local peaks, with local peaks 32 occurring at the apices of excursions 34 which extend above a signal magnitude threshold 36. The goal of peak reduction section 30 is to remove excursions 34, thereby reducing the magnitudes of local peaks 32. A local peak is a peak relative to immediate future and past portions of the signal. Other portions of a signal separated a significant distance in time from a local peak may exhibit a higher peak.

Signal magnitude threshold 36 defines the maximum local peak values to be achieved in a resulting reduced-peak communication signal 38 (FIG. 2) generated by peak reduction section 30 (FIG. 2). In comparison to the prior art peak reduction circuit whose operation is depicted in FIG. 1, signal magnitude threshold 36 varies rapidly, experiencing considerable variance over the entire time reflected in FIG. 4, and even over the duration of a single excursion 34. As discussed in more detail below, the variation in signal magnitude threshold 36 is responsive to a peak-tracking signal which is a both a leading and lagging indicator. And, signal magnitude threshold 36 varies to reflect information about the current state of the communication signal as the communication signal is being processed in peak reduction circuit 30. Thus, the delay between delayed inflated-peak communication signal 26' and inflated-peak communication signal 26 occurs to delay inflated-peak communication signal 26 into synchronism with signal magnitude threshold 36.

Referring back to FIG. 2, the output of communication signal source 24 also couples to an input of an envelope tracking section 40. Envelope tracking section 40 forms a peak-tracking signal 42 from inflated-peak communication signal 26, wherein signal magnitude threshold 36 is derived from peak-tracking signal 42.

Figure 5:
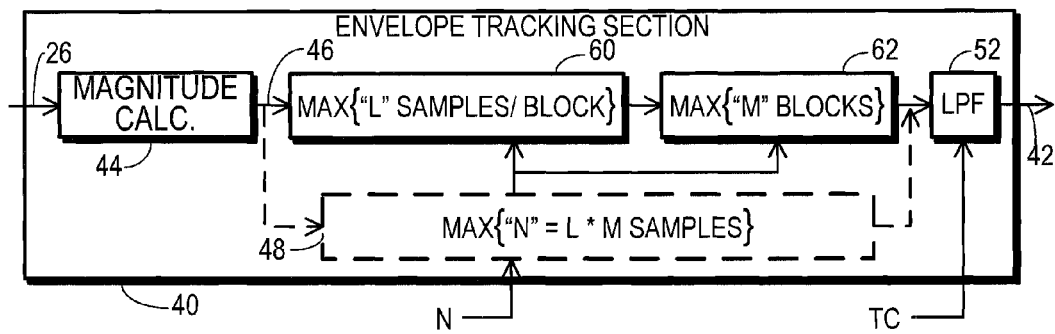
FIG. 5 shows a simplified block diagram of one embodiment of an envelope tracking section portion of the transmitter of FIG. 2.
Figure 6:
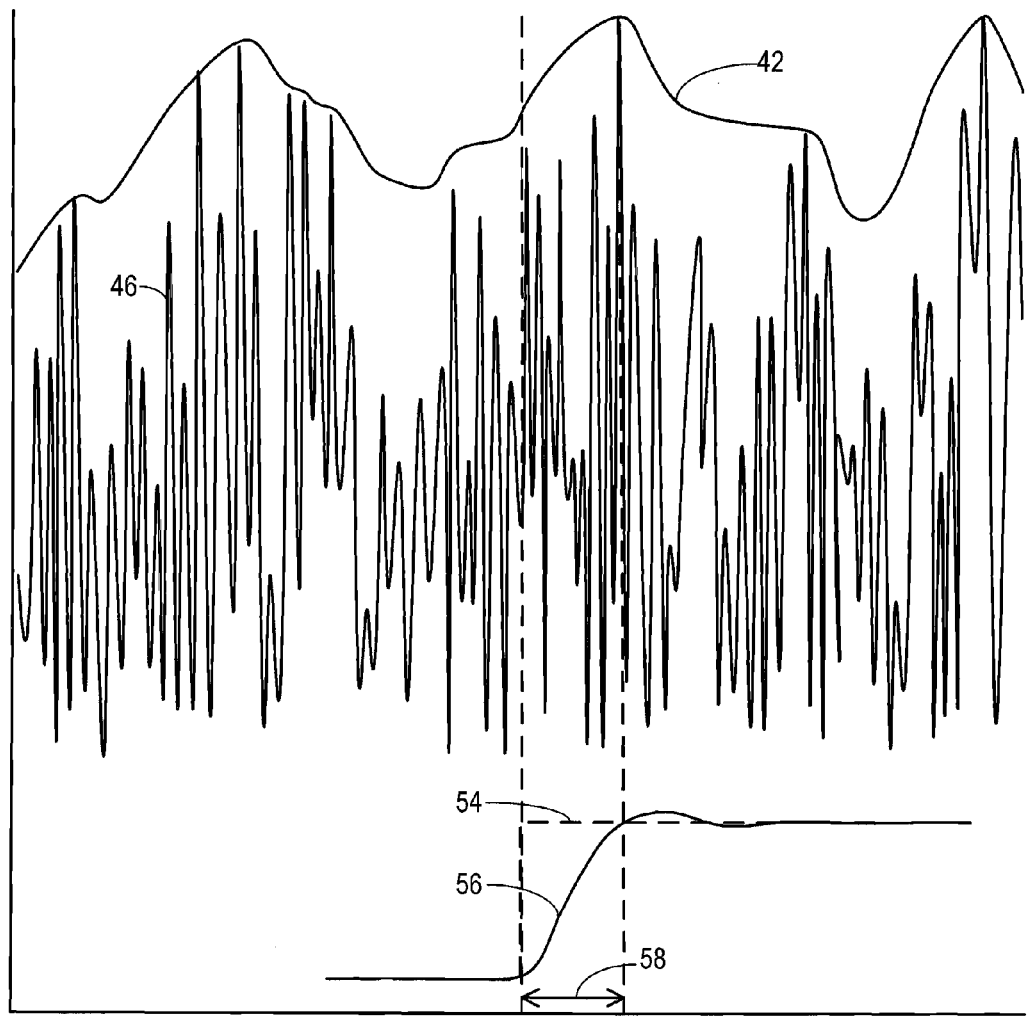
FIG. 6 shows a chart that graphically depicts a temporal plot of a peak-tracking signal relative to an inflated-peak communication signal on which it is based.

FIG. 5 shows a simplified block diagram of one embodiment of envelope tracking section 40. And, FIG. 6 shows a chart that graphically depicts a temporal plot of peak-tracking signal 42 relative to a magnitude expression of inflated-peak communication signal 26. Referring to FIGS. 5-6, within envelope tracking section 40, inflated-peak communication signal 26 drives a magnitude calculation section 44 which, on a sample-by-sample basis, calculates the instantaneous magnitude of the sample stream that conveys inflated-peak communication signal 26. This instantaneous magnitude (i.e., the envelope) is expressed in an envelope signal 46. The graphical depiction of an exemplary envelope signal 46 in FIG. 6 may cover around 1200 samples on its horizontal axis, showing the lively dynamic nature of the amplitude content of inflated-peak communication signal 26. Roughly speaking, envelope signal 46 exhibits a bandwidth about twice that of bandwidth 28 (FIG. 3) for inflated-peak communication signal 26.

In a conceptually straight-forward embodiment of envelope tracking section 40, a maximum sample detector 48 receives envelope signal 46 and identifies the greatest peak that has occurred in envelope signal 46 within the last "N" samples. This conceptually straight-forward embodiment is depicted in FIG. 5 using a dotted-line box. In one embodiment, the constant "N" is controlled by a tracking loop (not shown) that roughly controls "N" to precisely achieve an optimized bandwidth 50 (FIG. 3) of peak-tracking signal 42. But in other embodiments, "N" may simply be provided as a constant. As an example, with a bandwidth 50 for peak-tracking signal 42 of around 100 KHz and a bandwidth 28 (FIG. 3) of around 20 MHz for inflated-peak communication signal 26, "N" may be on the order of 200-800 samples. This maximum peak within a timing window of "N" samples serves as the output of maximum sample detector 48 until an even greater peak is encountered or until the window of "N" samples has transpired. At all instants, the output of maximum sample detector 48 equals the maximum signal envelope value over the past "N" samples. The output of maximum sample detector 48 is then filtered in a low-pass filter (LPF) 52 having a time constant (TC) compatible with the bandwidth 50. In one embodiment, this time constant may be controlled by a tracking loop that roughly controls "TC" to achieve optimized bandwidth 50. But in other embodiments, "TC" may simply be provided as a constant. The output of low-pass filter 52 provides peak-tracking signal 42, depicted as in FIG. 6.

Transmitter 20 implements both peak reduction and dynamic amplifier bias control. The peak reduction is configured to be effective for peak control purposes (e.g., reduce signal peaks, increase average power, etc.) and also to enable dynamic amplifier bias control to achieve further significant PAE improvements. Moreover, peak reduction and dynamic amplifier bias control are integrated with predistortion to compensate for any amplifier nonlinearity that may be exacerbated by the peak reduction and dynamic amplifier bias control techniques.

Desirably, the dynamic amplifier bias control technique used by transmitter 20 is an envelope tracking technique, where a lowered bandwidth bias control signal is produced, and a variable bias signal generator provides to an RF power amplifier a variable bias signal that accurately tracks the bias control signal. For an envelope tracking form of dynamic amplifier bias control, greater PAE improvements could be achieved using higher bandwidth variable bias signals. But practical considerations of the cost of components used to form the variable bias signal generator, power consumption, and other considerations limit the bandwidth of the variable bias signal to being considerably less than the bandwidth 28 of the communication signal. Bandwidth 50 of peak-tracking signal 42 is optimized where it is sufficiently high to take full advantage of the tracking capabilities of the components used to form the variable bias signal generator, but no higher. In one embodiment, bandwidth 50 may be set in the range of 75%-100% of the maximum bandwidth that can be accurately tracked by the variable bias signal generator. Otherwise, some of the limited bandwidth capacity of the components that form the variable bias signal generator will be wasted.

For comparison purposes, FIG. 6 also shows a step track 54 and a second-order, low-pass filter response 56 to step track 54. Response 56 roughly models the response of a switching power supply (discussed below) to a hypothetical bias control signal resembling step track 54. A delay 58 is commensurate with bandwidth 50 of peak-tracking signal 42 and of the power supply. FIG. 6 shows that response 56 is far too slow to respond to envelope signal 46, but is compatible with the lowered-spectrum, peak-tracking signal 42.

In a more preferred implementation of maximum sample detector 48, the timing window variable "N" is recognized as being the product of "L" samples per block of samples times "M" blocks of samples. Thus, in this implementation envelope signal 46 drives a first maximum detector 60 that detects the maximum value of samples in each of "M" blocks, where each block has "L" contiguous samples. Then, the output of maximum detector 60 drives a second maximum detector 62 that detects the maximum sample from among the "M" blocks, and uses that maximum to drive low-pass filter 52. No separate detector 48 is included in this implementation. This configuration is more preferred due to its simpler implementation.

Those skilled in the art will appreciate that the FIG. 5 implementations are but two of a wide variety of suitable envelope tracking section configurations. In general, any envelope tracking section directed toward the following three goals may be adequate for the purposes of transmitter 20. First, peak-tracking signal 42 should remain at a greater amplitude than envelope signal 46 at substantially all samples. Second, peak-tracking signal 42 should remain at as low an amplitude as possible for as long as possible without violating the first goal. And third, peak-tracking signal 42 should exhibit a fundamental frequency sufficiently low that a practical and economical implementation of a variable bias signal generator can track it without violating the first and second goals, but no lower than necessary.

Referring back to FIG. 2, peak-tracking signal 42 drives a first input of a scaling section 64, and a second input of scaling section 64 receives a control signal 66 from a controller 68. Signal magnitude threshold 36 is derived from peak-tracking signal 42 in scaling section 64 and provided to an input of peak reduction section 30, which converts inflated-peak communication signal 26 into reduced-peak communication signal 38 in response to signal magnitude threshold 36.

Figure 7:
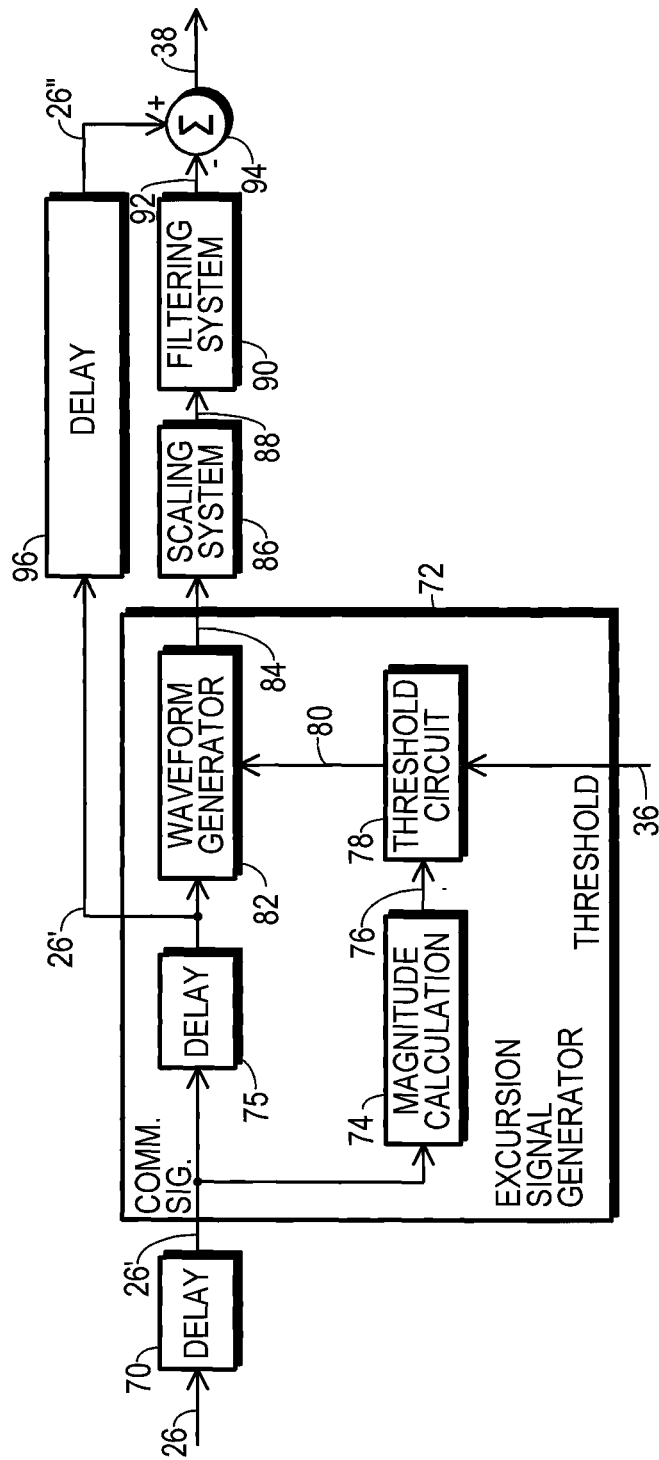
FIG. 7 shows a simplified block diagram of one embodiment of a peak reduction section for the transmitter of FIG. 2.

FIG. 7 shows a simplified block diagram of one embodiment of peak reduction section 30. In general, peak reduction section 30 is a cancelation circuit, where an excursion signal is formed that, when subtracted from an appropriately delayed version of inflated-peak communication signal 26, produces reduced-peak communication signal 38. As shown in FIG. 7, inflated-peak communication signal 26 is provided to an input of a delay element 70, and an output of delay element 70 provides delayed inflated-peak communication signal 26'.

As discussed above in connection with FIG. 4, inflated-peak communication signal 26 is delayed into synchronism with signal magnitude threshold 36. This delay occurs in delay element 70. Referring to FIGS. 5-7, delay element 70 implements a delay that roughly equals the sum of delay 58 (FIG. 6) plus one-half of "N" samples (FIG. 5). Assuming that envelope tracking section 40 reacts instantly to the detection of a peak in envelope signal 46 (FIG. 6) but that low pass filter 52 needs a significant amount of time (e.g., delay 58) to slew or ramp to that peak value, this amount of delay will cause inflated-peak communication signal 26 to appear at an excursion signal generator 72 of peak reduction section 30 about when peak-tracking signal 42 and signal threshold magnitude 36 are at their ramped-up levels.

Moreover, while peak-tracking signal 42 and signal magnitude threshold 36 are influenced by "N" samples of envelope signal 46, the delay of delay element 70 accounts for only one-half of the "N" samples. Thus, in excursion signal generator 72 where signal magnitude threshold 36 is recombined with inflated-peak communication signal 26, signal magnitude threshold 36 both leads and lags inflated-peak communication signal 26. In other words, for each instant of delayed inflated-peak communication signal 26', signal magnitude threshold 36 is influenced by inflated-peak communication signal 26 corresponding to that instant and at future and past instants relative to that instant.

Delayed inflated-peak communication signal 26' is provided to a first input of excursion signal generator 72, and signal magnitude threshold 36 is provided at a second input of excursion signal generator 72. At the first input of excursion signal generator 72, delayed inflated-peak communication signal 26' is routed to a magnitude calculation section 74 and to a delay element 75. Magnitude calculation section 74 converts signal 26' into an envelope signal 76, which is provided along with signal magnitude threshold 36 to inputs of a threshold circuit 78. Using signal magnitude threshold 36, threshold circuit 78 forms an excursion envelope signal 80 from envelope signal 76.

Figure 8:
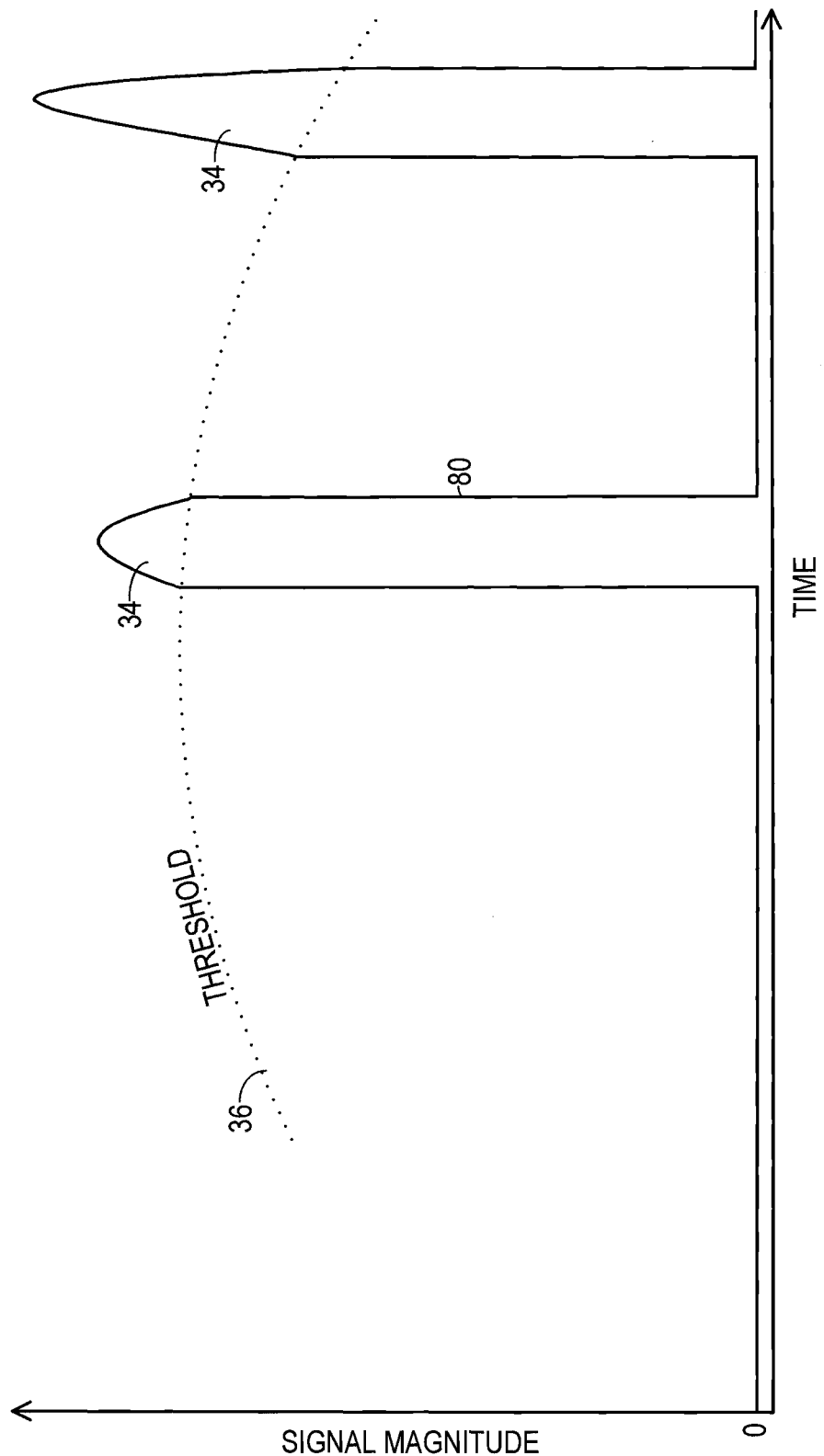
FIG. 8 shows an exemplary excursion envelope signal generated in the peak reduction section of FIG. 7.

FIG. 8 shows a representative example of an excursion envelope signal 80 that is consistent with the example of FIG. 4. Excursions 34 and signal magnitude threshold 36 are represented in signal 80. Other than during excursions 34, the envelope of delayed inflated-peak communication signal 26' is masked by signal magnitude threshold 36. Delay element 75 further delays delayed communication signal 26' to maintain temporal alignment with the magnitude signal propagating through magnitude calculation section 74 and threshold circuit 78. Excursion envelope signal 80 and further delayed inflated-peak communication signal 26' from delay element 75 drive different inputs of a waveform generator 82. Waveform generator 82 combines phase information from further delayed inflated-peak communication signal 26' with magnitude information from excursion envelope signal 80 into a signal which presents both the magnitude and phase of the communication signal during excursions 34, and zero magnitude at all other times.

Waveform generator 82 and excursion signal generator 72 provide an excursion signal 84 at their outputs, and excursion signal 84 drives a scaling system 86. A scaled excursion signal 88 output from scaling system 86 drives an input to a filtering system 90. Filtering system 90 provides a filtered excursion signal 92 to a negative input of a subtracting circuit 94. Delayed inflated-peak communication signal 26' from delay element 75 is again delayed in a delay element 96 to produce a delayed inflated-peak communication signal 26". Delay element 96 compensates for the signal delay imposed by waveform generator 82, scaling system 86, and filtering system 90. Delayed inflated-peak communication signal 26" drives a positive input of subtracting circuit 94, and an output of subtracting circuit 94 generates reduced-peak communication signal 38 for peak reduction section 30. Scaling system 86 scales excursion signal 84 to compensate for amplitude that will be lost in the subsequent filtering operation of filtering system 90. Together, scaling system 86 and filtering system 90 manipulate excursion signal 84 so that the spectral character of filtered excursion signal 92 resides substantially in-band and so that filtered excursion signal 92 exhibits an amplitude needed to cause reduced-peak communication signal 38 to exhibit local peaks 32 no greater than signal magnitude threshold 36.

Figure 9:
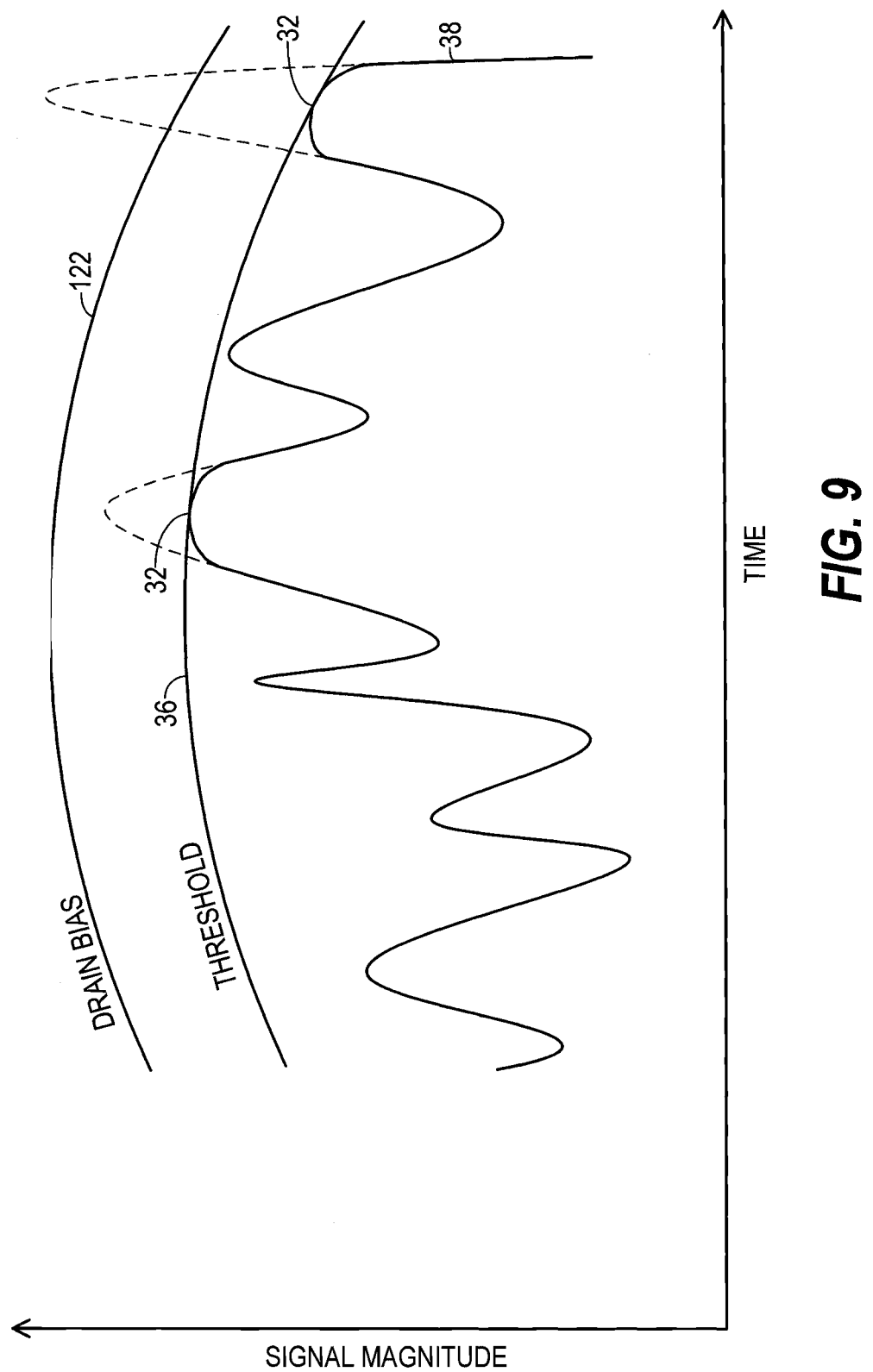
FIG. 9 shows an exemplary reduced-peak communication signal generated by the peak reduction section of FIG. 7.

FIG. 9 shows a representative example of a reduced-peak communication signal 38 generated by peak reduction section 30 that is consistent with FIG. 4 and FIG. 8. Local peaks 32 have been reduced as needed so that the entirety of reduced-peak communication signal 38 is below signal magnitude threshold 36. In FIG. 9 now-reduced local peaks from inflated-peak communication signal 26 are shown as dotted lines for comparison purposes, but are not present in reduced-peak communication signal 38.

FIG. 7 shows only one of a variety of different forms of PAPR reduction circuits that may be implemented by peak reduction section 30. Peak reduction section 30 differs from the similar peak reduction section described in U.S. Pat. No. 7,747,224 in that a signal magnitude threshold 36 is generated responsive to inflated-peak communication signal 26, and inflated-peak communication signal 26 is delayed into synchronism with the signal magnitude threshold 36 so that the signal magnitude threshold 36 is recombined with the communication signal in a manner that causes it to have been influenced by past and future instances of the communication signal.

As shown in FIG. 2, an output from peak reduction section 30 couples to a first input of a predistorter 98. Predistorter 98 intentionally distorts reduced-peak communication signal 38, converting it into a predistorted, reduced-peak communication signal 100. An output of predistorter 98 couples to an input of an amplifying section 102, where predistorted, reduced-peak communication signal 100 is amplified to produce an amplified communication signal 104. In the preferred embodiment, predistorter 98 and predistorted, reduced-peak communication signal 100, and all sections and signals located upstream from signal 100 are digital in nature. Amplifying section 102 may include digital-to-analog conversion, upconversion, and filtering, along with an amplifier portion 106. While predistorted, reduced-peak communication signal 100 and other upstream forms of the communication signal are positioned at baseband, amplified communication signal 104 is at RF due to the upconversion that occurs in amplifying section 102. Amplified communication signal 104 is broadcast from transmitter 20 at an antenna 108.

Those skilled in the art will appreciate that while amplifier portion 106 is desirably as linear as practical, it will fail to be perfectly linear. As a result, amplified communication signal 104 will be distorted. It is the job of predistorter 98 to distort reduced-peak communication signal 38 in a compensating manner so that amplified communication signal 104 appears to be as faithful and as linear a reproduction of reduced-peak communication signal 38 as practical. Nevertheless, a portion of the power of signal 104 will be signal power, which is the portion of signal 104 that is helpful and useful to a receiver (not shown) in demodulating and recovering raw data streams 22, and another portion will be noise power, which is the portion of signal 104 that is not helpful, and often harmful, to the receiver.

As discussed above, transmitter 20 implements an envelope-tracking form of dynamic amplifier bias control. A bias control signal 110 that drives the dynamic amplifier bias control is also provided to a second input of predistorter 98. Bias control signal 110 is derived from peak-tracking signal 42. In particular, in the embodiment depicted in FIG. 2 peak-tracking signal 42 is supplied to a first input of a scaling section 112, and a control signal from controller 68 drives a second input of scaling section 112. A scaled tracking signal 114 generated by scaling section 112 then drives a first input of an offset section 116, where a second input of offset section 116 is driven by another control signal from controller 68. An output of offset section 116 generates bias control signal 110. Bias control signal 110 also drives a variable bias signal generator 118, after delay in a delay element 120.

One example of a suitable variable bias signal generator 118 is described in U.S. Pat. No. 7,570,931. In general, variable bias signal generator 118 receives input power from a power source 119 and is configured to convert the input power from power source 119 into variable bias signal 122 in a manner that tracks bias control signal 110. Power source 119 may be, but is not required to be, a battery. Variable bias signal 122 serves to provide biasing to amplifier portion 106 of amplifying section 102.

Biasing refers to the typically DC voltages and currents that are applied to power inputs and signal inputs of amplifiers so that they will reproduce an input signal in a desired manner. Through biasing, a desired operating point is established for amplifier portion 106. While amplifier portion 106 of amplifying section 102 may be provided by any of a large variety of active semiconductor and other amplifying devices, using field-effect transistor (FET) terminology, the biasing refers to typically DC voltages applied to the drain and gate of an FET, RF power amplifier. Since variable bias signal 122 is variable, it is not precisely a DC signal, but in the preferred embodiments it varies at a rate defined by bandwidth 50 (FIG. 3) that is usually far, far less than the RF signal that amplifier portion 106 amplifies. The operating point is the point on the family of characteristic curves for amplifier portion 106 that corresponds to the average electrode voltages or currents in the absence of a communication signal.

Figure 10:
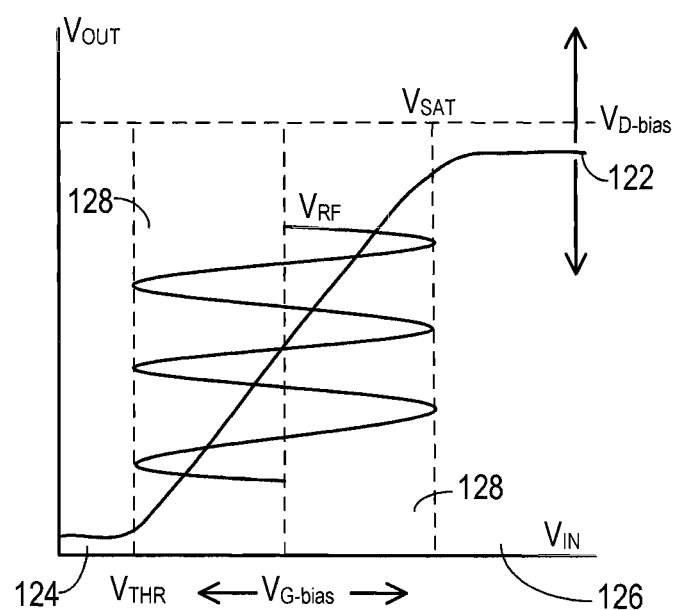
FIG. 10 shows a chart that graphically depicts transfer characteristics of a typical RF power amplifier biased to operate at an operating point.

FIG. 10 shows a chart that graphically depicts transfer characteristics of a typical RF power amplifier biased to operate at an operating point. The chart of FIG. 10 depicts class A operation, but this is not a requirement for amplifier portion 106. Three potential regions of operation are depicted in FIG. 10. In a cutoff region 124, the input voltage is beneath a threshold ($V_{THR}$), and regardless of the precise input voltage, the output voltage exhibits the same low level. In a saturation region 126, the input voltage is greater than a predetermined level, but regardless of the precise input voltage, the output exhibits substantially the same high level. The size of cutoff region 124 is primarily determined by the semiconductor and other architectural characteristics of the RF power amplifier.

But the point at which the RF power amplifier transitions into saturation region 126 is determined in part by a bias voltage ($V_{D-bias}$) because a saturation voltage $V_{SAT}$ is a small amount less than this bias voltage. It is this bias voltage that is provided by variable bias signal 122. Using FET terminology, variable bias signal 122 provides the drain bias voltage. If the variable bias signal 122 increases, the point at which amplifier operation transitions into saturation region 126 likewise increases, and if variable bias signal decreases, the point at which operation transitions into saturation region 126 likewise decreases.

For class A operation, the input and output signals for the RF power amplifier should be maintained between cutoff region 124 and saturation region 126 at all times. This is a linear region 128 of operation. Within linear region 128, the amplifier output is proportional to the input, and that proportion remains substantially constant regardless of the signal amplitude. Classes of operation other than Class A result when the RF power amplifier is biased so that at least a portion of the signal being amplified extends into either cutoff region 124 or saturation region 126.

For class A operation, the RF amplifier's power draw from its power input is proportional to its power input voltage, regardless of signal amplitude. At higher signal amplitudes more power is transmitted toward an antenna, and at lower signal amplitudes more power is consumed or wasted in the RF power amplifier itself. The highest or best instantaneous efficiency results at the instants when the highest peak-amplitude signal is amplified. At these instants, another bias voltage applied to the signal input of the RF power amplifier ($V_{G-bias}$) is desirably precisely centered in linear region 128. Otherwise the peaks of the signal being amplified will enter cutoff and saturation regions 124 and 126. At maximum efficiency, the peaks of the signal being amplified will extend within linear region 128 just to, but not into, either of cutoff or saturation regions 124 and 126. The lowest or worst efficiency results at instants when the lowest peak-amplitude signal is amplified. At these instants, the peaks of the signal being amplified are close to one another, and it is less important where in linear region 128 the signal resides so long as the peaks do not extend into cutoff or saturation regions 124 or 126.

In a preferred embodiment of the present invention, variable bias signal 122 is desirably varied so that the RF power amplifier operates in classes A and/or AB at substantially all times and so that the peaks of the communication signal being amplified remain as near to cutoff region 124 and saturation region 126 as practical within constraints imposed by power and bandwidth requirements. FIG. 9 shows how variable bias signal 122 tracks signal magnitude threshold 36 and remains sufficiently above peaks 32 of the communication signal to avoid operation in saturation region 126. Both signal magnitude threshold 36 and bias control signal 110 are derived from peak-tracking signal 42.

Bias signal generator 118 is desirably configured to meet cost and power consumption concerns which cause variable bias generator 118 to have a limited ability to cause variable bias signal 122 to track bias control signal 110. In particular, cost and power consumption concerns desirably cause bias signal generator 118 to accurately track bias control signal 110 within a bandwidth 130 (FIG. 3), which is far less than bandwidth 28 exhibited by the communication signal.

Figure 11:
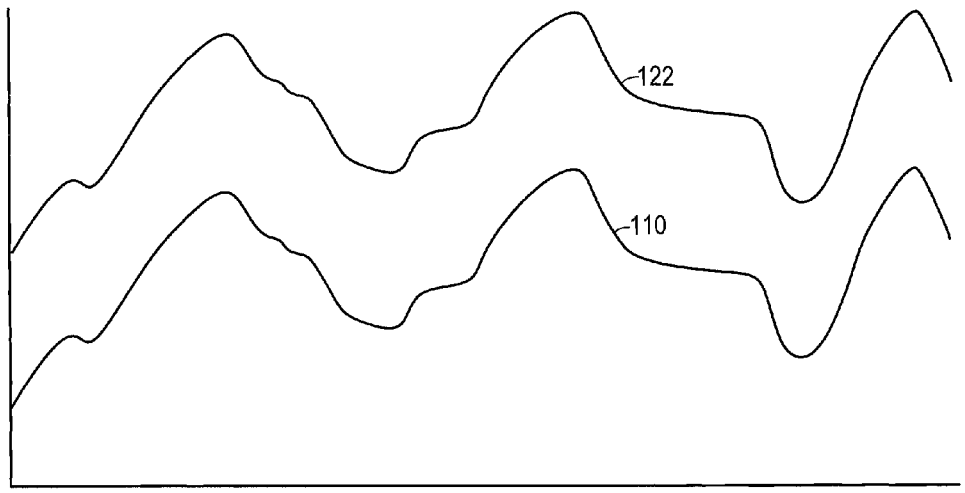
FIG. 11 shows a chart that graphically depicts a temporal plot of an exemplary bias control signal confined within a given bandwidth relative to a variable bias signal derived from the bias control signal by a variable bias signal generator of the transmitter of FIG. 2.
Figure 12:
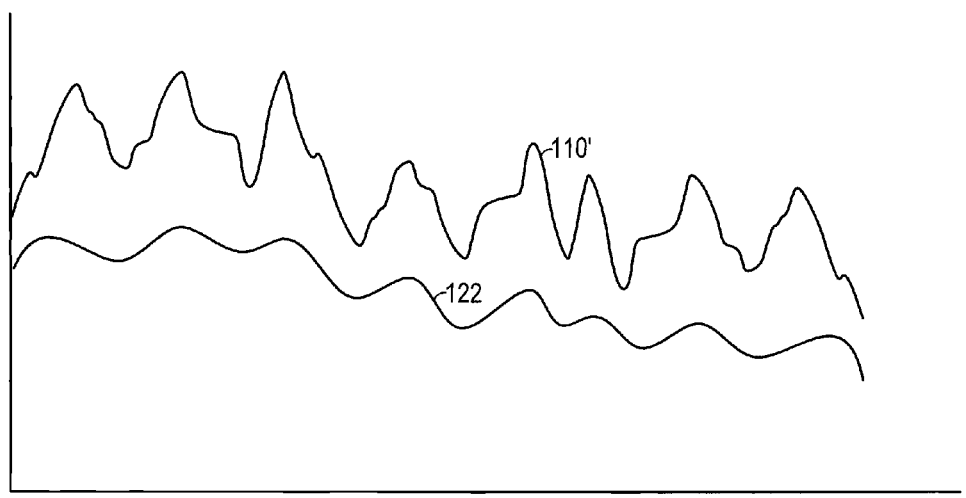
FIG. 12 shows a chart that graphically depicts a temporal plot of the bias control signal exhibiting a bandwidth beyond that referenced in FIG. 11 relative to the variable bias signal.

FIG. 11 shows a chart that graphically depicts a temporal plot of an exemplary bias control signal 110 confined within bandwidth 130 (FIG. 3) relative to variable bias signal 122, which is derived from bias control signal 110 by variable bias signal generator 118. FIG. 11 shows that variable bias signal 122 tracks bias control signal 110 within bandwidth 130 (FIG. 3). In other words, the spectral content of bias control signal 110 is substantially reflected in variable bias signal 122. In contrast, FIG. 12 shows a chart that graphically depicts a temporal plot of a hypothetical bias control signal 110' exhibiting a spectral configuration that extends beyond bandwidth 130 relative to variable bias signal 122. FIG. 12 shows that the configuration of bias signal generator 118 causes variable bias signal 122 to fail to track bias control signal 110 beyond bandwidth 130. In other words, a large portion of the spectral content of bias control signal 110 is not present in variable bias signal 122.

Figure 13:
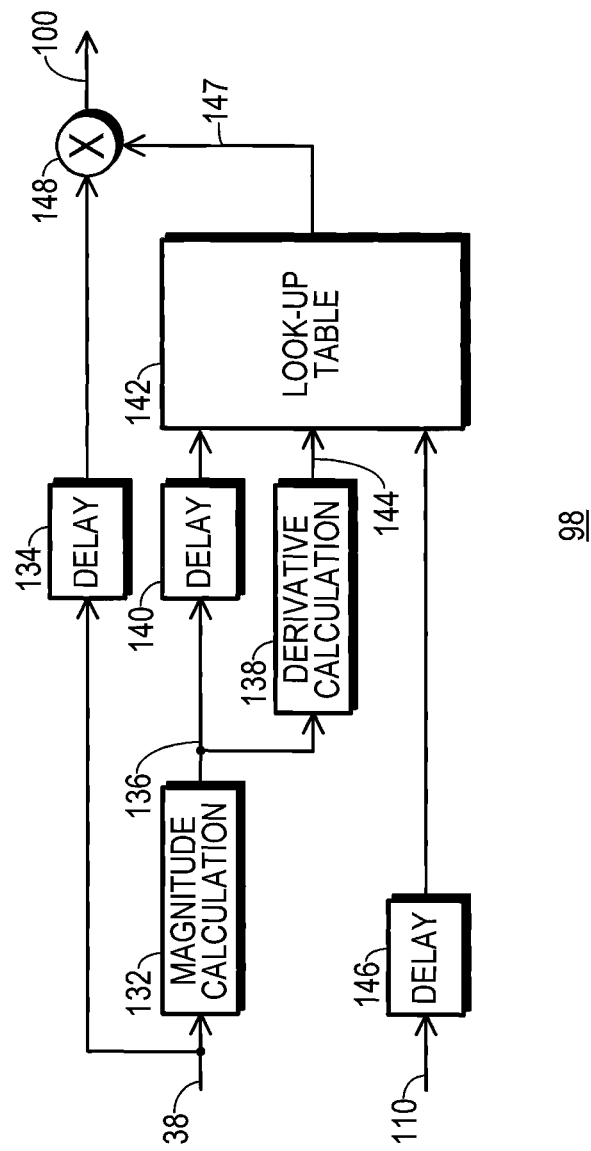
FIG. 13 shows a simplified block diagram of one embodiment of a predistorter portion of the transmitter of FIG. 2.

One example of a predistorter 98 that may be suitable for use in transmitter 20 is described in International Publication Number WO2012/061038, published 10 May 2012, and entitled "Transmitter Linearized In Response To Derivative Signal And Method Therefor," which is incorporated by reference in its entirety herein. FIG. 13 shows a simplified block diagram of a predistorter 98 configured in accordance with the teaching of International Publication Number WO2012/061038, but this specific embodiment is not a requirement in transmitter 20.

Referring to FIG. 13, reduced-peak communication signal 38 drives a magnitude calculation section 132 and a delay element 134. Magnitude calculation section 132 generates an envelope signal 136 that drives a derivative calculation section 138 and a delay element 140. Outputs of delay element 140 and derivative calculation section 138 couple to address inputs of a look-up table 142. Delay element 140 delays envelope signal 136 into synchronism with a magnitude derivative signal 144 generated by section 138 at the address inputs of look-up table 142.

As discussed above, reduced-peak communication signal 38 is responsive to peak-tracking signal 42 (FIG. 2). But peak-tracking signal 42 has only a small and indirect influence on reduced-peak communication signal 38. Bias control signal 110, which is independently derived from peak-tracking signal 42 is delayed in a delay element 146, then applied to a separate address input of look-up table 142. Delay element 146 delays bias control signal 110 into synchronism with envelope signal 136 and magnitude derivative signal 144 at the address inputs of look-up table 142. Based on the three envelope signal, 136, magnitude derivative signal 144, and bias control signal 110 inputs to look-up table 142, look-up table 142 determines, on a sample by sample basis, a gain factor 147 by which reduced-peak communication signal 38 should be scaled to appropriately distort it so that amplifying section 102 (FIG. 2) will apply an inverse distortion and cause amplified communication signal 104 (FIG. 2) to appear as having been more nearly linearly amplified. Thus, gain factor 147 drives a first input of a scaling section 148, and reduced-peak communication signal 38, after being delayed in delay element 134, drives a second input of scaling section 148, and scaling section 148 provides predistorted, reduced-peak communication signal 100. Delay element 134 delays reduced-peak communication signal 38 into synchronism with gain factor 147.

Although not shown, additional circuits may be provided which are responsive to reduced-peak communication signal 38 and to amplified communication signal 104 and which cause look-up table 142 to continuously adapt itself toward improving its ability to compensate for nonlinearity of amplifying section 102. International Publication Number WO2012/061038 discusses such adaptation circuits in more detail.

It is desirable to configure the distortion applied through look-up table 142 to reduced-peak communication signal 38 in response to bias control signal 110 because bias control signal 110, when considered in connection with envelope signal 136, characterizes on a sample-by-sample basis how closely amplifier portion 106 (FIG. 2) operates to its saturation region 126 (FIG. 10). Those skilled in the art will appreciate that positioning of the operating point for amplifier portion 106 relative to saturation region 126 (FIG. 10) is a significant determinant of the linearity of amplifier portion 106. Without considering bias control signal 110, or a similar signal, predistorter 98 will be unable to adequately linearize amplifier section 102. In an alternate embodiment (not shown) bias control signal 110 and envelope signal 136 may be combined, then the combined signal applied to address inputs of look-up table 142, rather than using separate inputs as shown in FIG. 13.

Referring back to FIG. 2, amplified communication signal 104 is fed back to a noise power measurement section 150. Noise power measurement section 150 desirably down-converts and digitizes signal 104, then processes signal 104, preferably in connection with reduced-peak communication signal 38 (not shown), to generate a noise power indicator 152. One desirable indicator 152 characterizes an error vector magnitude (EVM) parameter of amplified communication signal 104. As is conventional with EVM indicators, section 150 may accumulate a multiplicity of instantaneous error samples over a period of time so that noise power indicator 152 is an average, integrated, or low-pass filtered signal. FIG. 3 depicts a typical bandwidth 154 which characterizes the update rate of noise power indicator 152. FIG. 3 shows that bandwidth 154 is less than, and preferably less than ½ of, bandwidth 50 for peak-tracking signal 42, signal magnitude threshold 36, and bias control signal 110. This difference in bandwidths 50 and 134 allows separate control loops which influence EVM to operate independently of one another, but those skilled in the art can devise alternate techniques for decoupling these control loops.

Noise power indicator 152 is applied to an input of controller 68. In response to noise power indicator 152, controller 68 adjusts the control signals it supplies to scaling section 64, scaling section 112, and offset section 116. Thus, bias control signal 110 and signal magnitude threshold 36 are adjusted to hold EVM at a desired level, preferably at or slightly below the maximum EVM allowed by the specification for transmitter 20. Preferably, controller 68 implements different control loops having considerably different bandwidths for adjusting bias control signal 110 and signal magnitude threshold 36 so that the control loops are substantially independent from one another.

By integrating peak reduction and an envelope tracking form of dynamic amplifier bias control as discussed herein, improvements in power consumption can be achieved. In particular, by configuring peak reduction so that the reduced peaks are compatible with a reduced bandwidth of a bias signal generator, envelope tracking can better track the resulting reduced-peak communication signal. And, envelope tracking can be applied over a wider range of drain voltage, further increasing PAE.

Moreover, the integration of peak reduction and an envelope tracking form of dynamic amplifier bias control allows improvements in peak reduction. The prior art EVM-controlled, signal magnitude threshold tends to reduce a few local peaks to a considerable degree. But the noise induced by this type of peak reduction varies as the square of the amount of reduction achieved. Only a few peaks can be reduced while remaining within a skimpy EVM budget. For example, the prior art type of peak reduction may reduce one peak by 3 volts and increase noise power by the same amount as may be achieved using the techniques described herein to reduce nine peaks by 1 volt. By following the techniques taught herein, the very largest peaks are not reduced as much as occurs with the prior art type of peak reduction. These largest peaks are also compensated herein to some degree by dynamic amplifier bias control. The outsized impact on increased noise power that results from greatly reducing a few large local peaks is avoided and replaced by many smaller reductions in many local peaks. Thus, the coordination between peak reduction and envelope tracking described herein achieves far greater overall performance than achievable by simply combining the two operations.

In summary, at least one embodiment of the present invention provides a linearized transmitter and a transmitter linearizing method that integrate peak reduction and dynamic amplifier bias control to achieve power consumption benefits that are not otherwise available. At least one embodiment of the present invention provides a transmitter with peak reduction that uses a highly variable, leading and lagging, signal magnitude threshold to define magnitudes for local peaks in a reduced-peak communication signal. At least one embodiment of the present invention provides a transmitter with peak reduction that is responsive to a current state of the communication signal whose peaks are being reduced. At least one embodiment of the present invention provides a transmitter with peak reduction and an envelope tracking form of dynamic amplifier bias control that uses a common, lowered bandwidth, peak-tracking signal to derive a signal magnitude threshold for the peak reduction and a bias control signal for the dynamic amplifier control. At least one embodiment of the present invention integrates a transmitter's peak reduction, predistortion, and dynamic amplifier bias control to achieve a desirable power-added efficiency in the transmitter's amplifier and a desirable degree of linearity.

Although the preferred embodiments of the invention have been illustrated and described in detail, it will be readily apparent to those skilled in the art that various modifications and adaptations may be made without departing from the spirit of the invention or from the scope of the appended claims. For example, those skilled in the art will appreciate that the specific functions depicted herein through the use of block diagrams and circuit diagrams may be partitioned in equivalent but different ways than shown and discussed herein. Such equivalent but different ways and the modifications and adaptations which may be implemented to achieve them are to be included within the scope of the present invention. Likewise, while certain operational conditions have been mentioned herein for the purposes of teaching the invention, the invention may be applied in connection with other operational conditions. In one alternate embodiment, envelope tracking may be extended to variable biasing applied to an amplifier's signal input, such as a FET gate, by adding another envelope tracking section that produces a peak-tracking signal exhibiting a bandwidth higher than the one described herein, adding another bias signal generator, and adapting the predistorter to address the variable gate biasing. These and other equivalent modifications and adaptations are included within the scope of the present invention.

What is claimed is:

1. A transmitter configured to transmit a communication signal, said transmitter comprising:
   a communication-signal source configured to produce an inflated-peak communication signal which exhibits a first bandwidth;
   an envelope tracking section which is responsive to said inflated-peak communication signal and configured to generate a peak-tracking signal which tracks magnitude peaks in said inflated-peak communication signal and exhibits a second bandwidth that is lower than said first bandwidth;
   a peak reduction section which converts said inflated-peak communication signal into a reduced-peak communication signal, said peak reduction section being responsive to a signal magnitude threshold which establishes maximum local peak values for said reduced-peak communication signal, said signal magnitude threshold being responsive to said peak-tracking signal, and said peak reduction section being configured to delay said inflated-peak communication signal into synchronism with said signal magnitude threshold, then combine said signal magnitude threshold with said delayed inflated-peak communication signal in order to form said reduced-peak communication signal; and
   an amplifying section responsive to said reduced-peak communication signal.

2. A transmitter as claimed in claim 1 wherein for each instant of said inflated-peak communication signal and of said signal magnitude threshold, said signal magnitude threshold is influenced by future instances of said inflated-peak communication signal instants.

3. A transmitter as claimed in claim 2 wherein for each instant of said inflated-peak communication signal and of said signal magnitude threshold, said signal magnitude threshold is influenced by past instances of said inflated-peak communication signal.

4. A transmitter as claimed in claim 1 additionally comprising a variable bias signal generator configured to provide a variable bias signal to said amplifying section, said variable bias signal being derived from said peak-tracking signal.

5. A transmitter as claimed in claim 4 wherein:
   said variable bias signal generator is responsive to a bias control signal;
   said variable bias signal generator is configured to cause said variable bias signal to track said bias control signal within a third bandwidth and to fail to track said bias control signal beyond said third bandwidth;
   said bias control signal is derived from said peak-tracking signal; and
   said envelope tracking section is configured so that said peak-tracking signal exhibits a second bandwidth which is less than or equal to said third bandwidth.

6. A transmitter as claimed in claim 5 wherein said envelope tracking section is configured so that said second bandwidth is greater than 75% of said third bandwidth.

7. A transmitter as claimed in claim 5 wherein:
   said bias control signal is a second bias control signal that is delayed relative to a first bias control signal;
   said transmitter additionally comprises a predistorter which is responsive to said reduced-peak communication signal and is also responsive to said first bias control signal, said predistorter being configured to generate a predistorted reduced-peak communication signal; and
   said amplifying section amplifies said predistorted reduced-peak communication signal.

8. A transmitter as claimed in claim 1 wherein:
   said transmitter additionally comprises a predistorter which is responsive to said reduced-peak communication signal and is independently responsive to said peak-tracking signal, said predistorter being configured to generate a predistorted reduced-peak communication signal; and
   said amplifying section is responsive to said predistorted reduced-peak communication signal.

9. A transmitter as claimed in claim 1 wherein:
   said amplifying section generates an amplified communication signal that exhibits both signal power and noise power; and
   said signal magnitude threshold is also responsive to said noise power.

10. A transmitter as claimed in claim 9 wherein:
said signal magnitude threshold is responsive to a noise power indicator signal which is responsive to said noise power and is configured to exhibit a third bandwidth; and
said second bandwidth is greater than said third bandwidth.

11. A transmitter as claimed in claim 10 wherein said second bandwidth is at least twice said third bandwidth.

12. A transmitter as claimed in claim 10 wherein, at each instant in time, said peak-tracking signal is responsive to a first time period of said inflated-peak communication signal, said noise power indicator signal is responsive to a second time period of said inflated-peak communication signal, and said second period occurs before said first period.

13. A method of transmitting a communication signal, said method comprising:
producing an inflated-peak communication signal exhibiting a first bandwidth;
converting a delayed version of said inflated-peak communication signal and a signal magnitude threshold into a reduced-peak communication signal, said signal magnitude threshold defining maximum local peak values for said reduced-peak communication signal;
forming a peak-tracking signal which tracks magnitude peaks in said inflated-peak communication signal and which exhibits a second bandwidth that is less than said first bandwidth;
deriving said signal magnitude threshold from said peak-tracking signal so that during said converting step, for each instant of said delayed version of said inflated-peak communication signal and of said signal magnitude threshold, said signal magnitude threshold is influenced by future instances of said delayed version of said inflated-peak communication signal; and
amplifying said reduced-peak communication signal.

14. A method as claimed in claim 13 wherein:
said amplifying step is performed using an RF amplifier that has operating points defined by a variable bias signal; and
said method additionally comprises generating said variable bias signal in response to said peak-tracking signal.

15. A method as claimed in claim 14 wherein:
said generating step is configured so that said variable bias signal tracks a bias control signal within a third bandwidth and fails to track said bias control signal beyond said third bandwidth;
said bias control signal is derived from said peak-tracking signal; and
said forming step is configured so that said second bandwidth is less than or equal to said third bandwidth.

16. A method as claimed in claim 13 wherein:
said method additionally comprises distorting said reduced-peak communication signal to produce a predistorted reduced-peak communication signal by using a look-up table having a first input derived from said reduced-peak communication signal and a second input independently derived from said peak-tracking signal; and
said amplifying step amplifies said predistorted reduced-peak communication signal.

17. A method as claimed in claim 13 wherein:
said amplifying step generates an amplified communication signal that exhibits both signal power and noise power; and
said deriving step also derives said signal magnitude threshold from said noise power.

18. A method as claimed in claim 17 wherein:
said deriving step is configured so that said signal magnitude threshold is responsive to a noise power indicator signal; and
said noise power indicator signal is responsive to said noise power and is configured to exhibit a third bandwidth.

19. A transmitter configured to transmit a communication signal, said transmitter comprising:
a communication-signal source configured to produce an inflated-peak communication signal exhibiting a first bandwidth;
an envelope tracking section which is responsive to said inflated-peak communication signal and configured to generate a peak-tracking signal which tracks magnitude peaks in said inflated-peak communication signal, said peak-tracking signal exhibiting a second bandwidth which is less than said first bandwidth;
a peak reduction section which has a delay element that is responsive to said inflated-peak communication signal and produces a delayed inflated-peak communication signal, and which reduces magnitude peaks in said delayed inflated-peak communication signal to generate a reduced-peak communication signal, said peak reduction section being responsive to a signal magnitude threshold that establishes maximum peak values for said reduced-peak communication signal and that is derived from said peak-tracking signal, wherein said delay element is configured so that said for each instant of said delayed inflated-peak communication signal and of said signal magnitude threshold, said signal magnitude threshold is responsive to future instants of said delayed inflated-peak communication signal;
a predistorter which distorts said reduced-peak communication signal and generates a predistorted reduced-peak communication signal, said predistorter being responsive to a bias control signal that configures distortion applied to said reduced-peak communication signal and is also derived from said peak-tracking signal; and
an amplifying section which amplifies said predistorted reduced-peak communication signal and is also responsive to a variable bias signal applied to an amplifier portion of said amplifying section to define an operating point for said amplifier portion, said variable bias signal being derived from said bias control signal.

20. A transmitter as claimed in claim 19 wherein:
said transmitter additionally comprises a variable bias signal generator which is responsive to said bias control signal and which generates said variable bias signal;
said variable bias signal generator is configured to cause said variable bias signal to track said bias control signal within a third bandwidth which is less than said first bandwidth and to fail to track said bias control signal beyond said third bandwidth; and
said envelope tracking section is configured so that said second bandwidth is less than or equal to said third bandwidth.

* * * * *